United States Patent
Gunji et al.

[11] Patent Number: 5,478,607
[45] Date of Patent: Dec. 26, 1995

[54] METHOD FOR USE OF PREFLUX, PRINTED WIRING BOARD, AND METHOD FOR PRODUCTION THEREOF

[75] Inventors: Hiroshi Gunji, Fukushima; Kenichi Yamaguchi, Saitama; Daikichi Tachibana, Tokyo, all of Japan

[73] Assignees: Hitachi Telecon Technologies Ltd.; Sanwa Laboratory Ltd., both of Japan

[21] Appl. No.: 880,198

[22] Filed: May 8, 1992

[30] Foreign Application Priority Data

May 17, 1991 [JP] Japan ................................. 3-167363
Sep. 4, 1991 [JP] Japan ................................. 3-250313

[51] Int. Cl.$^6$ ................................. B05D 3/06
[52] U.S. Cl. ................. 427/557; 427/553; 427/558; 427/340
[58] Field of Search .................. 148/23, 25, 269; 106/14.16; 427/96, 340

[56] References Cited

U.S. PATENT DOCUMENTS

| | | | |
|---|---|---|---|
| 3,933,531 | 1/1976 | Sawa et al. | 148/269 |
| 4,395,294 | 7/1983 | Hobbins et al. | 106/14.16 |
| 4,731,128 | 3/1988 | Casullo | 148/269 |

FOREIGN PATENT DOCUMENTS

| | | | |
|---|---|---|---|
| 428260 | 5/1991 | European Pat. Off. | |
| 428383 | 5/1991 | European Pat. Off. | |
| 2116012 | 10/1971 | Germany | 148/23 |
| 8300704 | 3/1983 | WIPO | |

*Primary Examiner*—Shrive Beck
*Assistant Examiner*—Erma Cameron
*Attorney, Agent, or Firm*—Wegner, Cantor, Mueller & Player

[57] ABSTRACT

A method for the production of a printed wiring board according to this invention includes applying a preflux represented by the following general formula (1):

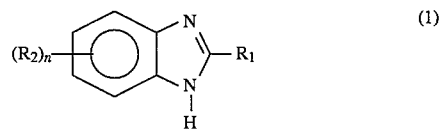

(wherein $R_1$ stands of H or an alkyl group of one to 17 carbon atoms, $R_2$ for H or an alkyl group of one to six carbon atoms, and n for an integer in the range between 0 and 3) or the following general formula (2):

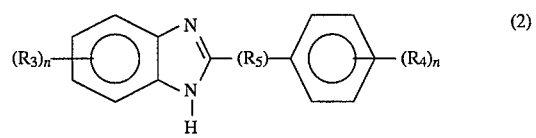

(wherein $R_3$ stands for H or an alkyl group of one to six carbon atoms, $R_4$ for H or an alkyl group of one to six carbon atoms, $R_5$ for an alkyl group of zero to seven carbon atoms, and n for an integer in the range between 0 and 3) to a printed wiring board on which circuits have been formed and then performing an oxidizing treatment on the printed wiring board.

17 Claims, 12 Drawing Sheets

METHOD FOR USE OF PREFLUX, PRINTED WIRING BOARD, AND METHOD FOR PRODUCTION THEREOF

BACKGROUND OF THE INVENTION

1. Field of the Invention

This invention relates to a method for improving the heatproofness and chemical resistance of preflux to be used as for soldering metals. It further relates to a printed wiring board which, in the operation of mounting electronic parts in high density on the opposite surfaces of the printed wiring board and reflow soldering them to the surfaces, allows the surfaces thereof to be wetted thoroughly with the solder and enables the soldering inside through holes formed therein to be carried out with enhanced efficiency and to a method for the production of the printed wiring board.

2. Description of the Prior Art

The prefluxes which have been heretofore used for the purpose of rustproofing circuit parts of copper or copper alloy formed on a printed wiring board and intended to be soldered and retaining the circuit parts in a solderable state are broadly divided into two kinds, i.e. a resin type preflux intended to coat a printed wiring board wholly and an alkylimidazole type preflux intended to produce a chemical reaction selectively with the copper or copper alloy.

The former preflux is used by a method which comprises dissolving natural rosin, rosin ester, or rosin-modified maleic acid resin in an organic solvent, applying the resultant solution to a whole printed wiring board by spraying with a roll coater, immersion, or the combination thereof, and drying the applied layer of the solution thereby forming a film coating the printed wiring board.

The resin type preflux, owing to the use of the organic solvent, entails the disadvantage that the solvent evaporates into the ambient air and seriously jeopardizes environment and safety.

The alkylimidazole type preflux is soluble in water and excels in point of work environment and safety. It has the disadvantage that an alkylimidazole copper complex arising from the reaction of the preflux with the copper or copper alloy of the printed wiring board, on exposure to an elevated temperature, is decomposed and degenerated by the catalytic action of oxygen in the air and copper and consequently suffered to adhere fast to the circuit of copper or copper alloy, impede the action of a postflux, and impair the solderability of the circuit.

In recent years, the alkylimidazole type preflux has come to find growing utility on account of work environment and safety.

The printed wiring board is produced by a method which comprises applying the alkylimidazole type preflux to the printed wiring board and then reflow soldering electronic parts to the surfaces of the printed wiring board thereby effecting desired mounting of the electronic parts on the printed wiring board.

The reflow soldering techniques which have been developed to date to the level of commercialization and actually adopted for mounting electronic parts on the surfaces of a printed wiring board include air reflow, infrared reflow, near-infrared reflow, reflow of the type combining air reflow and infrared reflow, reflow performed in the atmosphere of nitrogen, and vapor reflow for performing soldering in the vapor phase of perfluorocarbon, for example.

When the alkylimidazole type preflux is applied to a surface as described above and then the reflow soldering is performed on the coated surface, the preflux which is consequently exposed to an elevated temperature poses the problem of heatproofness and chemical resistance. Thus, the surface of copper and copper alloy is invaded by a halogenide contained in a cream solder which is used as a solder and the moisture evaporating from within a printed wiring and the evaporating moisture goes to decomposing the perfluorocarbon, though only to a slight extent, with liberation of hydrofluoric acid and inevitably inducing corrosion of the surface of copper, with the result that the susceptibility of the surface to wetting with the solder during the process of reflow soldering, the efficiency of the soldering work performed subsequently to the step of reflowing in through holes formed in the printed wiring board, and the susceptibility of the through holes to wetting with the solder are degraded. Such is the true state of affairs.

The inventors, in the light of the problem mentioned above, continued a study in search of a metal soldering grade preflux endowed with improved heatproofness and chemical resistance, a printed wiring board susceptible to perfect wetting with solder even after two to three rounds of reflow soldering and capable of undergoing soldering with enhanced efficiency, and a method for the production of this printed wiring board. Consequently, they have found that their object is accomplished by performing an oxidizing treatment on an alkylbenzimidazole or a derivative thereof represented by the following general formula (1):

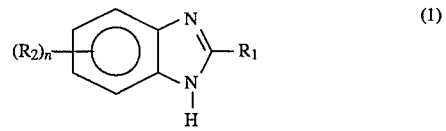

(wherein $R_1$ stands for H or an alkyl group of three to 17 carbon atoms, $R_2$ for H or an alkyl group of one to six carbon atoms, and n for an integer in the range between 0 and 3) or the following general formula (2):

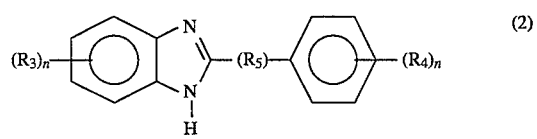

(wherein $R_3$ for H or an alkyl group of one to six carbon atoms, $R_4$ for H or an alkyl group of one to six carbon atoms, $R_5$ for an alkyl group of zero to seven carbon atoms, and n for an integer in the range between 0 and 3) and produced by a chemical reaction on the soldered part of copper or copper alloy of a printed wiring board.

They have also perfected a method for the production of a printed wiring board which is enabled to acquire improved heatproofness and chemical resistance and manifest perfect and efficient solderability and susceptibility to wetting with the solder even after two to three rounds of reflowing.

SUMMARY OF THE INVENTION

The first object of this invention is to provide a method for using a preflux so as to improve the heatproofness and chemical resistance of the preflux.

The second object of this invention is to provide a printed wiring board which produces a prominent effect of imparting improved solderability to the reflow to be used in mounting electronic parts on the surfaces of the printed wiring board and, as a result, enhancing the mounting density of electronic parts on the printed wiring board, and contributing to the miniaturization of electronic devices.

The third object of this invention is to provide a method for the production of a printed wiring board which is capable of imparting improved solderability to the reflow being used in mounting electronic parts on the surfaces of the printed wiring board.

The method for the use of a preflux according to this invention is characterized by applying to the surface of a metal a preflux containing as an active component thereof a compound represented by the following general formula (1):

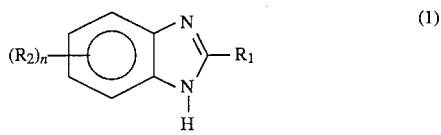

(wherein $R_1$ stands for H or an alkyl group of three to 17 carbon atoms, $R_2$ for H or an alkyl group of one to six carbon atoms, and n for an integer in the range between 0 and 3) [hereinafter referred to as (Chem. 1)] or the following general formula (2):

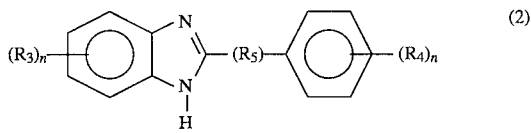

(wherein $R_3$ for H or an alkyl group of one to six carbon atoms, $R_4$ for H or an alkyl group of one to six carbon atoms, $R_5$ for an alkyl group of zero to seven carbon atoms, and n for an integer in the range between 0 and 3) and thereafter performing an oxidizing treatment thereon. This method of using the preflux is capable of improving the heatproofness and chemical resistance of the preflux.

The advantages of this invention will become more apparent from the following description which is made with reference to the accompanying drawings.

DESCRIPTION OF THE PREFERRED EMBODIMENT

Figure 1:
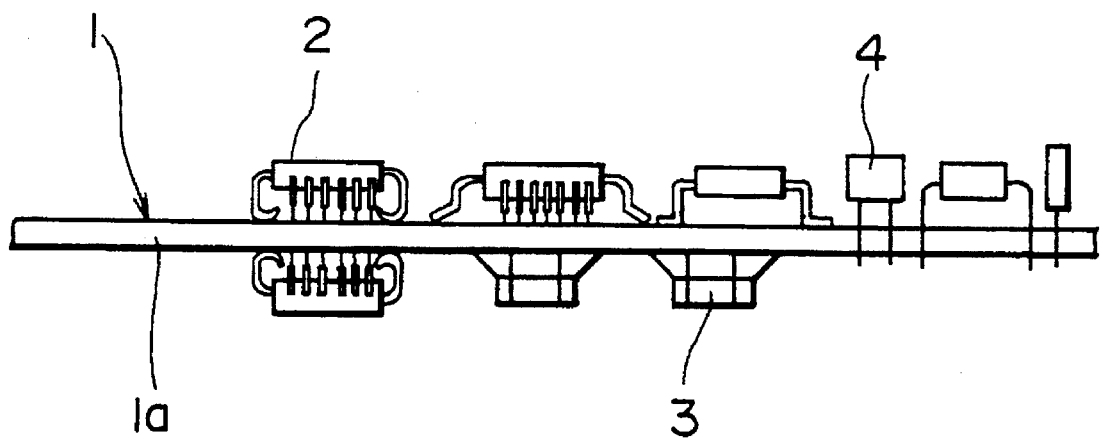
FIG. 1 is a side view illustrating part of a printed wiring board produced by mounting electronic parts on a printed wiring board proper in according to this invention.

A printed wiring board 1 has electronic parts 2 and 3 for mounting and a lead insertion part 4 for mounting as illustrated in FIG. 1 on the opposite surfaces for mounting of a printed wiring board proper 1a.

Figure 2:
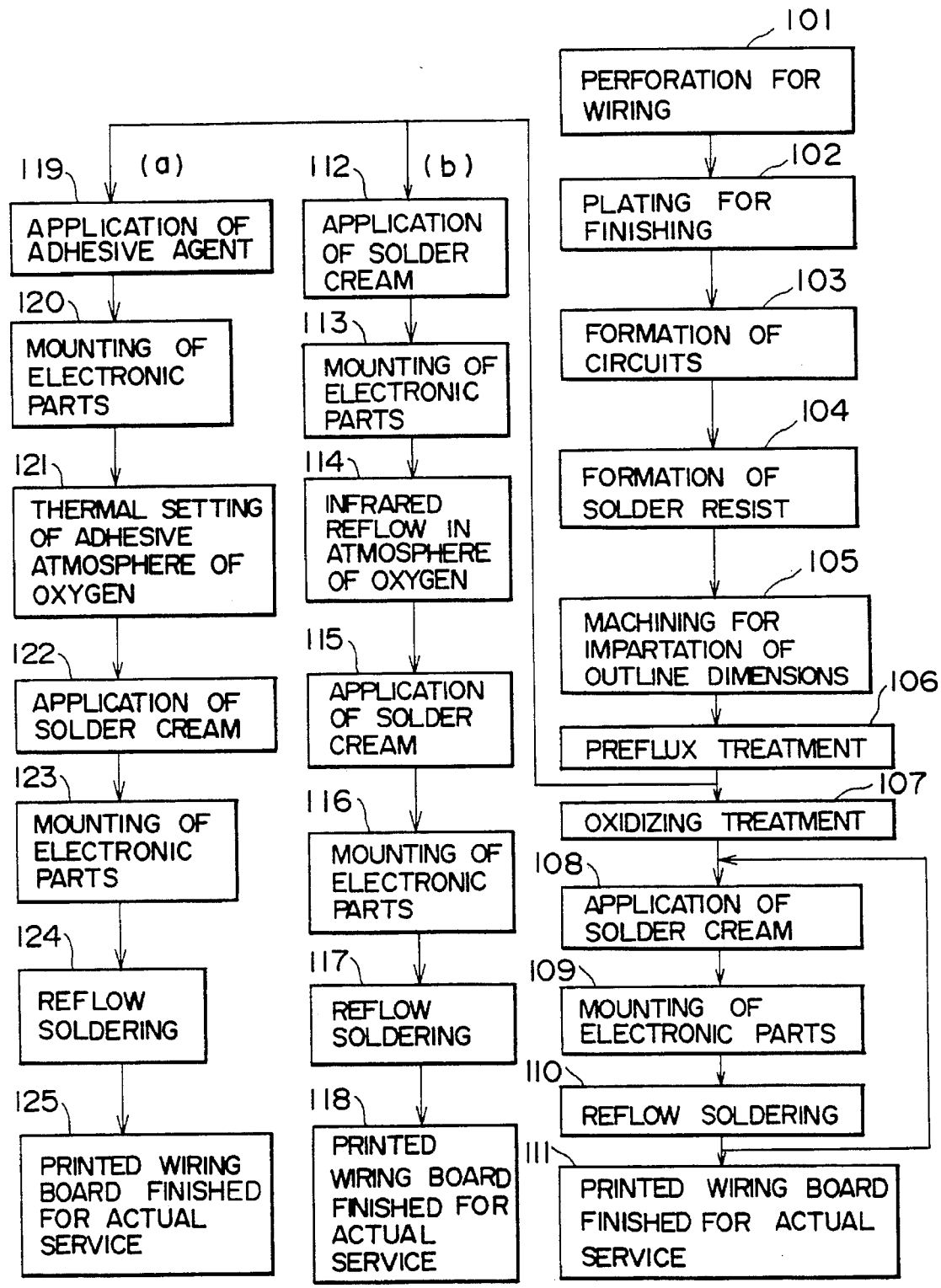
FIG. 2 is a flow chart representing a process for the production of a printed wiring board in accordance with this invention.

FIG. 2 is a diagram illustrating a process for the production of a printed wiring board (with copper through holes) of this invention. With reference to FIG. 2, first the printed wiring board proper 1a is subjected to perforation (101) for the formation of holes therein and the holes are finished by plating (102) for the formation of through holes. Then, circuits in a prescribed wiring pattern are formed (103) and a solder resist is formed by printing (104). Subsequently, the printed wiring board proper 1a is subjected to outline machining (105) for the impartation of outline dimensions thereto and to a preflux treatment (106). Thereafter, an oxidizing treatment (107) for the oxidation of the preflux applied to the printed wiring board 1a is carried out. This step completes the production of the printed wiring board 1.

The printed wiring board is finished for practical service (111) by applying solder cream (108) to the surfaces of the printed wiring board 1 obtained as described above, mounting the electronic parts 2 and 3 (109), and carrying out the step of reflow soldering (110).

Figure 3:
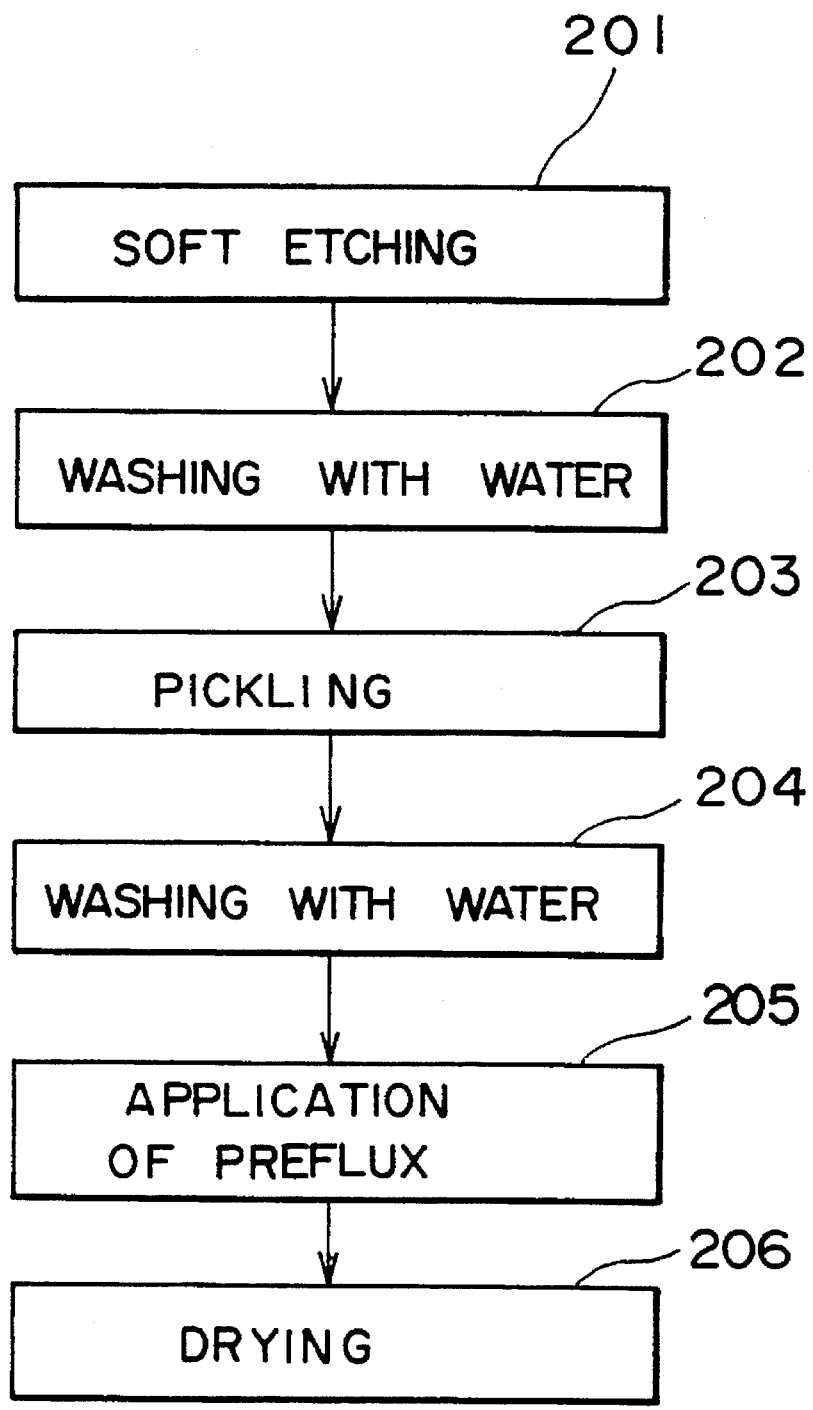
FIG. 3 is a flow chart representing the step of preflux treatment in the process for the production of a printed wiring board in accordance with this invention.

FIG. 3 is a diagram illustrating a detailed process for the preflux treatment (106) shown in FIG. 2. With reference to FIG. 3, the process starts with a soft etching treatment (201) by 20 to 30 seconds' immersion of the printed wiring board proper 1a in an aqueous solution containing 200 g of sodium persulfate per liter and kept at 30° C. Then, the printed wiring board proper 1a is subjected to a treatment of water washing (202).

Now, the printed wiring board proper 1a is subjected to a pickling treatment (203) by 20 seconds' immersion in an aqueous solution containing 3% of hydrochloric acid and held at normal room temperature. This treatment is followed by a treatment (204) for washing the printed wiring board proper 1a with water.

The washed print wiring board proper 1a is then subjected to a preflux treatment (205) by 60 to 80 seconds' immersion thereof in a solution containing benzimidazole or benzimidazole derivative represented by the general formula (1), preferably by the following general formula (3), or benzimidazole represented by the general formula (2), preferably by the following general formula (4) or an example of a derivative of benzimidazole, DOCOAT H produced by Sanwa Laboratory, and kept at 45° C. and consequent attachment (application) to the surface of copper of the printed wiring board proper 1a of a preflux resulting from a chemical reaction. The printed wiring board which has undergone the preflux treatment (205) is subjected to a drying treatment (206) under the conditions of 80° C. and 30 to 40 seconds.

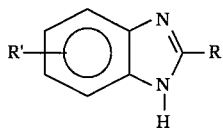

(wherein R stands for H or an alkyl group of one to 17 carbon atoms and R' for H or an alkyl group of one to three carbon atoms).

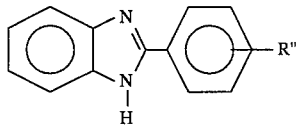

(wherein R" stands for H or an alkyl group of zero to three carbon atoms).

In this manner, the preflux treatment (106) shown in FIG. 2 is carried out.

As respects the oxidizing treatment (107) shown in FIG. 2, the first example of this oxidizing treatment consists in a heat treatment to be performed in an atmosphere of air, the second example thereof in a treatment with a chemical solution, and the third example thereof in a treatment of exposure to ozone ($O_3$).

The printed wiring board 1 produced by the process described above was tested to find how the oxidizing treatment performed after the application of preflux would improve the heatproofness and chemical resistance of the preflux. The results were as follows. In due consideration of the heatproofness and chemical resistance of the reflow solder, a vapor reflow treatment (passage of the printed wiring board 1 having no solder paste applied thereto through a treating tank intended for the vapor flow treatment) was performed twice and the outcome of this treatment was rated by the fraction defective of the solder after the step of flow dip soldering.

The conditions for the flow dip soldering were postflux, JS-64P, specific gravity between 0.84 and 0.86, soldering temperature 245° C., and soldering time three seconds.

Figure 4:
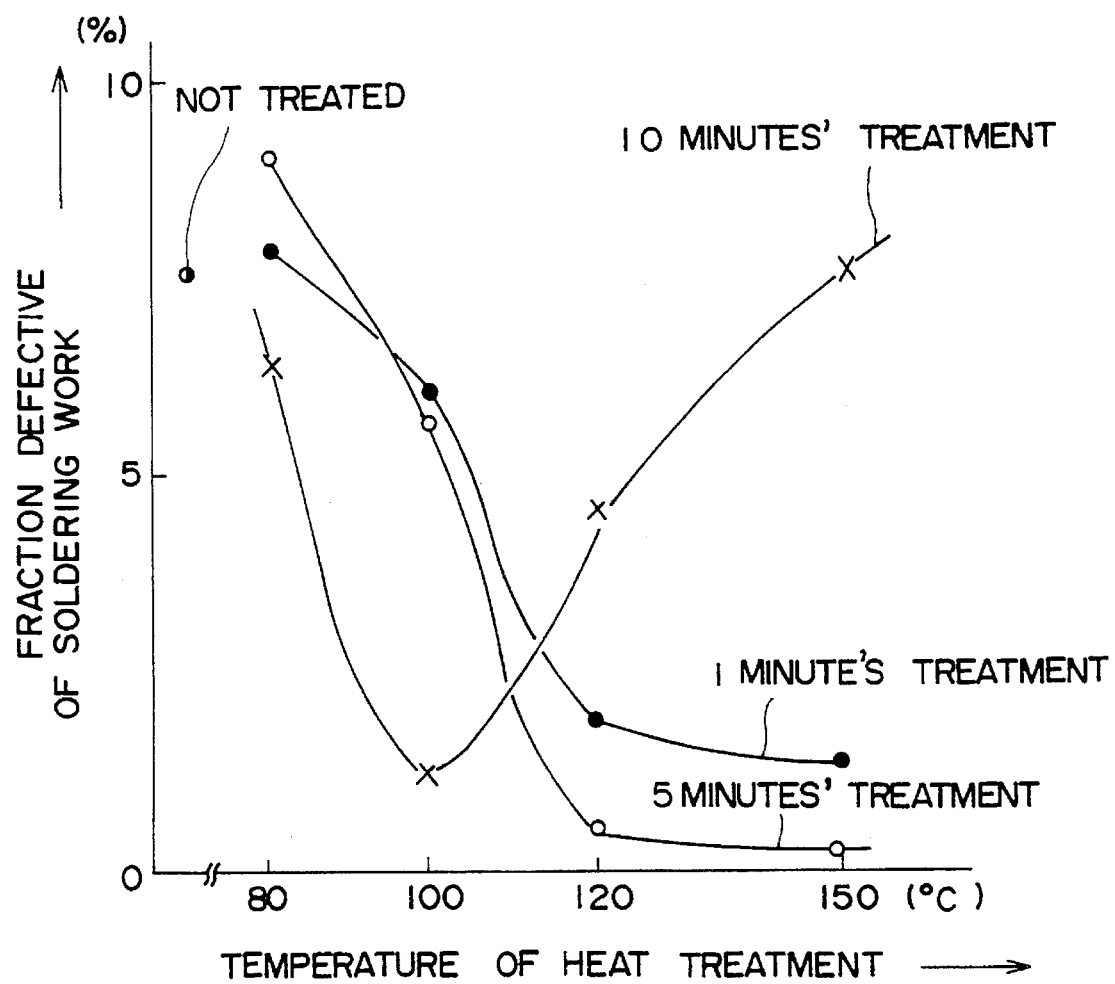
FIG. 4 is a graph showing the relation between the temperature of the heat treatment performed by way of oxidizing treatment in an atmosphere of air and the fraction defective of the soldering work.

As the first example of the oxidizing treatment, the case of a heat treatment performed in an atmosphere of air is depicted in FIG. 4. FIG. 4 shows the fraction defective of the soldering work in a heat treatment carried out at varying temperatures of 80°, 100°, 120°, and 150° C. for varying durations of 1, 5, and 10 minutes.

It has been found by this test that in the treatment at 100° C. for 10 minutes, the treatment at 120° C. for five minutes, and the treatment at 150° C. for varying periods in the range between one to five minutes, the fractions devective were 1/7 to 1/30 of the fraction defective found in the absence of the oxidizing treatment. This indicates that the oxidizing treatment produces a conspicuous improvement in the heatproofness and chemical resistance of the preflux.

Figure 5:
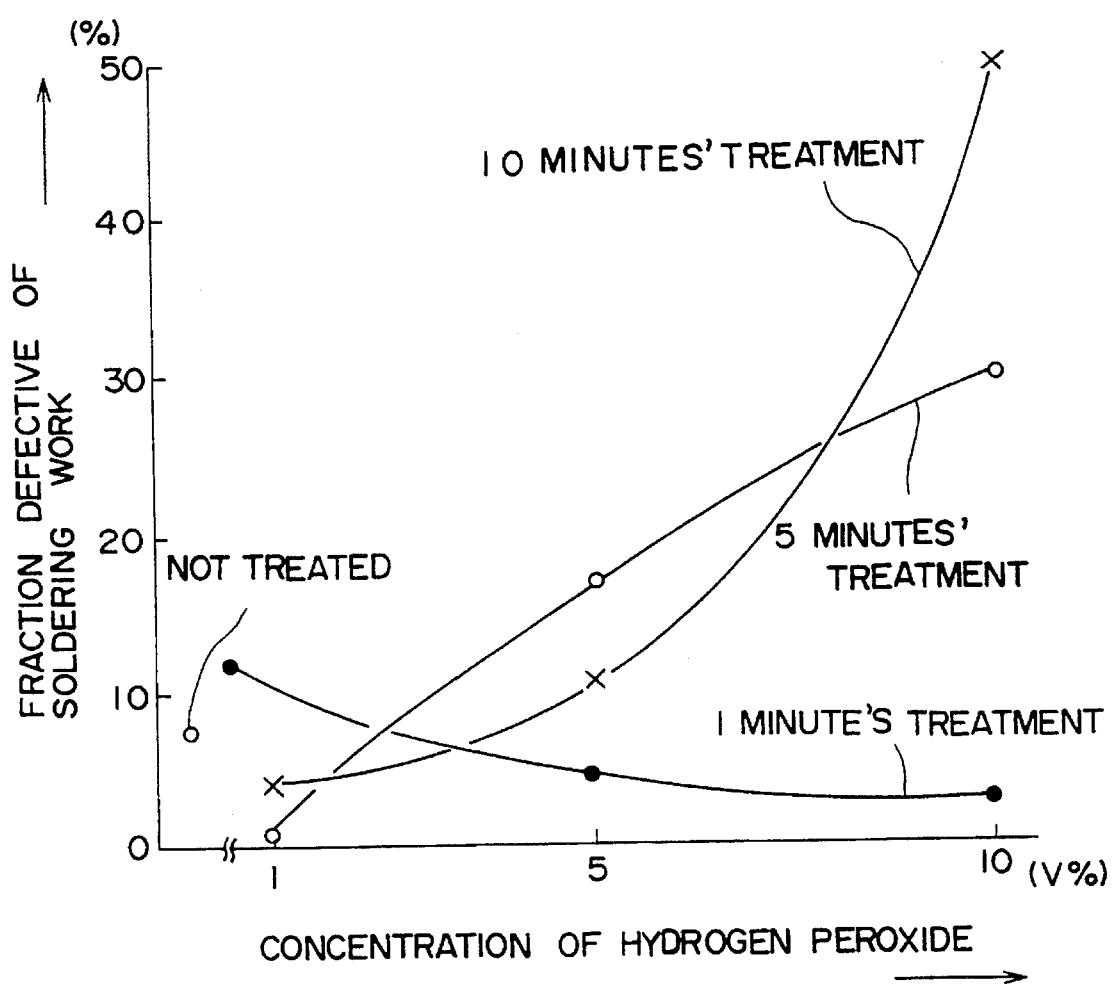
FIG. 5 is a graph showing the relation between the concentration of hydrogen peroxide and the fraction defective of the soldering work in the treatment with chemical solution which is intended as an oxidizing treatment.

Now, the case of using a treatment with chemical solution is depicted as the second example of the oxidizing treatment in FIG. 5.

As one example of the treatment with the chemical solution, samples of the printed wiring board 1 which had undergone the preflux treatment with Docoat H produced by Sanwa Laboratory were severally treated in aqueous solutions containing hydrogen peroxide in varying concentrations of 1, 5, and 10% invariably at normal room temperature for varying periods of 1, 5, and 10 minutes.

It has been found that in the case of concentration of 1%, the treatment for five minutes was most effective and lowered the fraction devective to 1/7 of that of the untreated sample. This fact indicates that the treatment with a chemical solution conspicuously enhances the heatproofness and chemical resistance of preflux.

The treatment with the chemical solution produces entirely the same effect when an aqueous 2% $Ca(ClO)_2 \cdot 3H_2O$ solution is used as when aqueous hydrogen peroxide solution is used.

The treatment by exposure to ozone ($O_3$) to be performed as the third example of the oxidizing treatment brings about entirely the same effect of improving the heatproofness and chemical resistance of the preflux.

Figure 8:
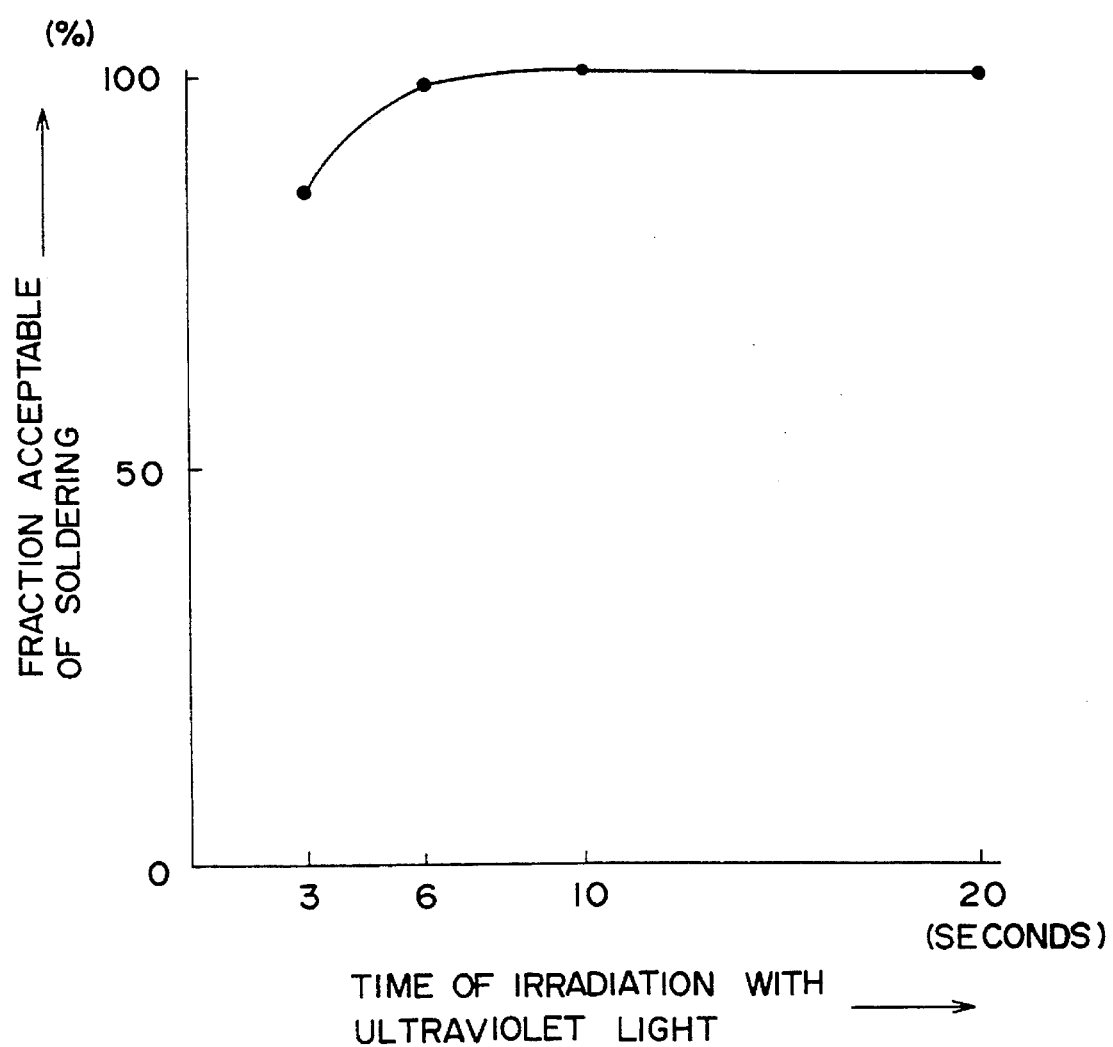
FIG. 8 is a graph showing a fraction defective of the soldering work performed in an ultraviolet irradiation treatment intended as an oxidizing treatment.
Figure 9:
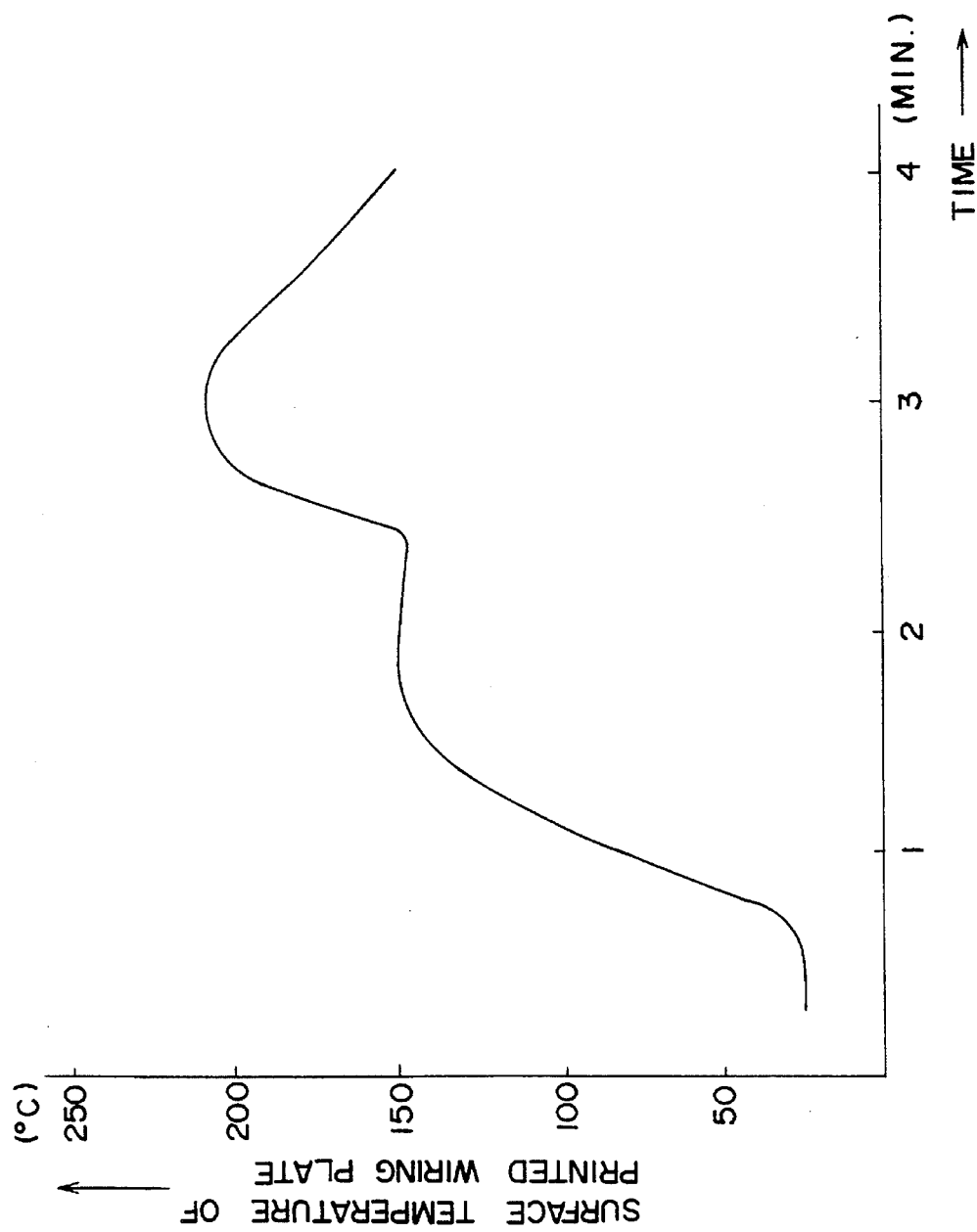
FIG. 9 is a graph showing a temperature profile obtained in a vapor reflow treatment.

The case of performing a treatment by irradiation with the ultraviolet light is depicted in FIG. 8 as the fourth example of the oxidizing treatment. As one example of the treatment by irradiation with the ultraviolet light, an ultraviolet lamp produced by Japan Storage Battery Co., Ltd. and rated for an electric power of 120 W/cm was used and samples of the printed wiring board were severally exposed to the light from the lamp for varying periods of 3, 6, 10, and 20 seconds to find fraction defectives of the soldering work. It has been found that the treatment time of about 10 seconds produces a fraction acceptable of 100% and effectively improves the heatproofness and chemical resistance.

As described above, the heatproofness and chemical resistance of the preflux is conspicuously improved by the method which comprises subjecting the printed wiring board 1 which has undergone the treatment for the formation of circuits thereon to the preflux treatment (106) shown in FIG. 2 using benzimidazole or benzimidazole derivative represented by the general formula (1), preferably the general formula (3), or benzimidazole or benzimidazole derivative represented by the general formula (2), preferably by the general formula (4), such as a proprietary product of Sanwa Laboratory marketed under trademark designation of "Docoat H," thereby causing the preflux to react upon copper or copper alloy and then performing the oxidizing treatment (107).

The oxidizing treatment mentioned above to be performed subsequently to the preflux treatment (106) in the form of a heat treatment, for example, at a varying temperature in the range between 100° and 150° C. for a varying period in the range between one and 10 minutes is effective in lowering the fraction defective to 1/7 to 1/30 of that of the untreated sample. This heat treatment can be easily accomplished by causing the printed wiring board 1 which has undergone the preflux treatment to be treated with a constant temperature bath or a conveyor type drying oven.

The oxidizing treatment is effectively obtained subsequently to the preflux treatment by a treatment with a chemical solution such as, for example, an aqueous 1% hydrogen peroxide at normal room temperature for five minutes. This treatment decreases the fraction defective of the soldering work to 1/7 of that of the untreated sample. This fact indicates that the treatment with the chemical solution is capable of prominently enhancing the heatproofness and chemical resistance of the preflux.

In the oxidizing treatment, use of an aqueous 2% $Ca(ClO)_2 \cdot 3H_2O$ solution is as effective as the use of the aqueous hydrogen peroxide solution mentioned above. This oxidizing treatment can be easily accomplished by immersing the printed wiring board in a bath of the chemical solution by shower spraying the chemical solution on the printed wiring board.

Otherwise, the oxidizing treatment can be as effectively performed subsequently to the preflux treatment by a treatment of exposure of the printed wiring board 1 to an atmosphere of ozone as by the treatment with the chemical solution. This treatment is easily performed by the use of a chamber adapted for the ozone treatment and brings about a conspicuous improvement in the heatproofness and chemical resistance of the printed wiring board.

When the oxidizing treatment is omitted from the process for the production of the printed wiring board 1, a heat treatment (performed at a temperature in the range between 120° and 150° C. for a period in the range between one and five minutes, for example) preparatory to the reflow treatment, i.e. a heat treatment given to the printed wiring board 20 produced in consequence of the process of steps 112 through 118 and steps 119 through 125 shown in FIGS. 2(a) and (b) in the open air in an atmosphere of oxygen during the step for mounting electronic parts, brings about the same effect as shown in FIG. 4. This heat treatment lowers the fraction defective of the soldering work to 1/7 to 1/30 of that of the untreated sample. It can prominently improve the heatproofness and chemical resistance of the printed wiring board.

Specifically, in the process shown in FIG. 2(a), solder cream is applied (112) to the surface of the printed wiring board 1 which has undergone the preflux treatment (106) and has been readied for mounting of electronic parts, the electronic parts are mounted (113) on the solder-coated surface, the solder cream is applied (115) to the other surface of the printed wiring board 1 for mounting other electronic parts, the electronic parts are mounted (116) on the solder-coated surface, and reflow soldering (117) is performed to complete a printed wiring board for actual service (118).

In the process shown in FIG. 2(b), adhesive agent is applied (119) to the surface of the printed wiring board 1 which has undergone the preflux treatment (106) and has been readied for mounting electronic parts, the electronic parts are mounted (120) to the adhesive-coated surface, solder cream is applied (122)-to the other surface of the printed wiring board 1 for mounting electronic parts, the electronic parts are mounted (123) on the solder-coated surface, and reflow soldering (124) is performed, to complete the printed wiring board (125) for actual service.

Figure 6:
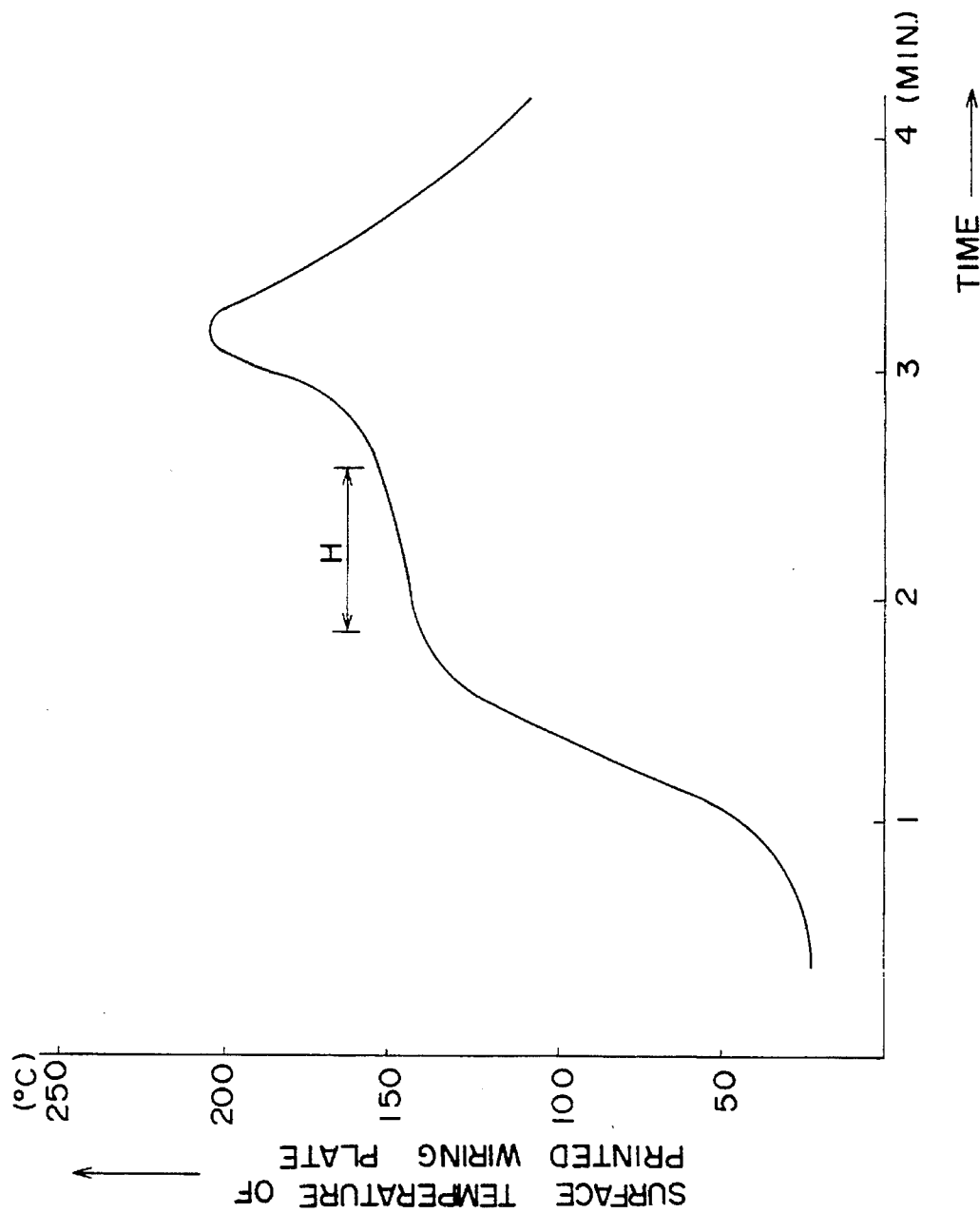
FIG. 6 is a graph showing a temperature profile obtained in an infrared reflow treatment.
Figure 7:
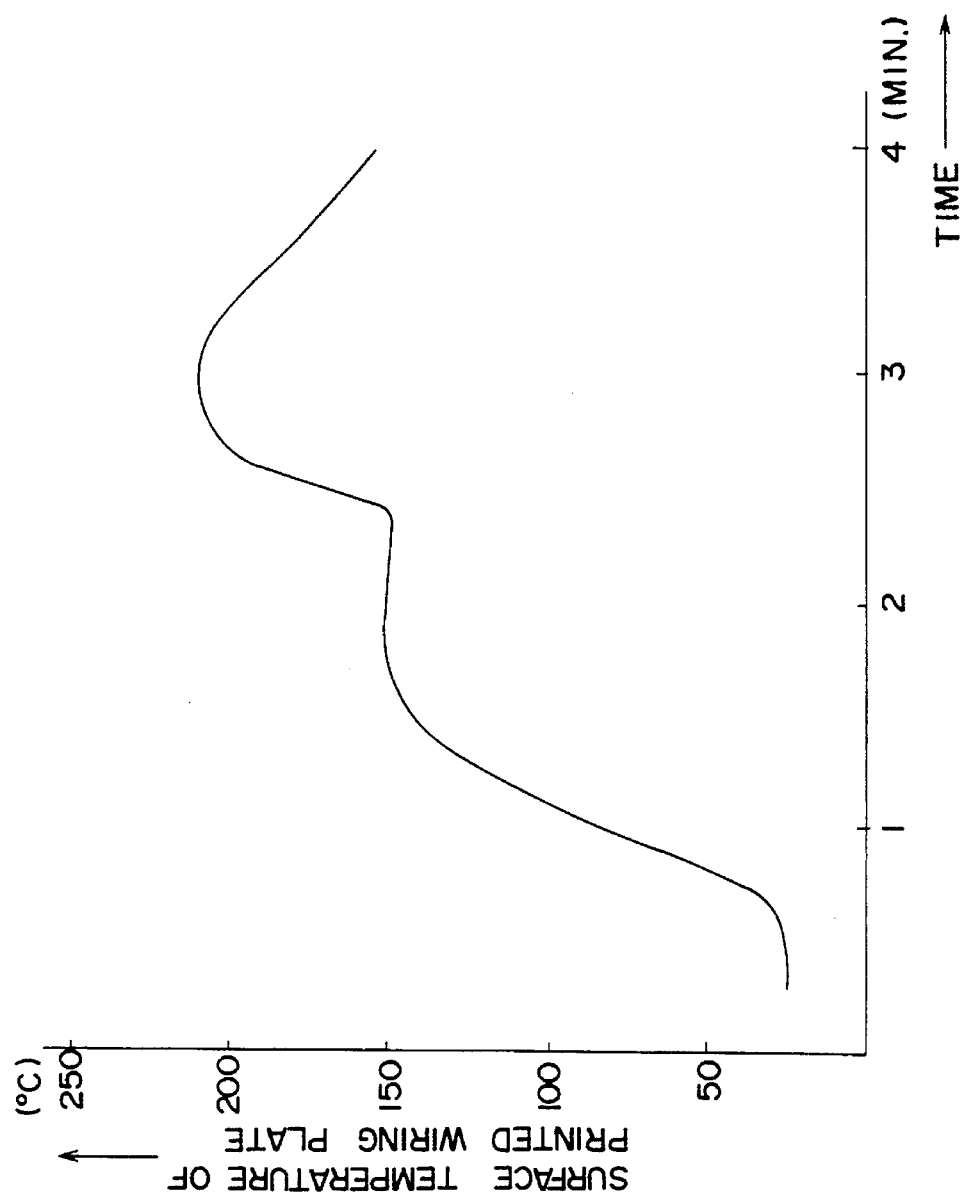
FIG. 7 is a graph showing a temperature profile obtained in a vapor reflow treatment.

FIG. 6 illustrates a temperature profile which is drawn during a reflow treatment with infrared light and FIG. 7 illustrates a temperature profile which is drawn during a vapor reflow treatment. In the temperature profile which is existent during the infrared light reflow treatment, the region indicated by H (part of the process of the preheating treatment) represents the duration for the oxidizing treatment.

Now, an experiment conducted for the purpose of confirming the effect of this invention will be described below.

In this experiment, a copper through hole printed wiring board was prepared, treated with preflux (produced by Sanwa Laboratory and marketed under trademark designation of "Docoat H"), and subjected to an oxidizing treatment at 150° C. for five minutes, to produce Sample A conforming to this invention. For comparison, Sample B was produced by following the procedure described above, excepting the oxidizing treatment was omitted, and Sample C was produced by the resin type preflux treatment which is in widespread use.

Figure 10:
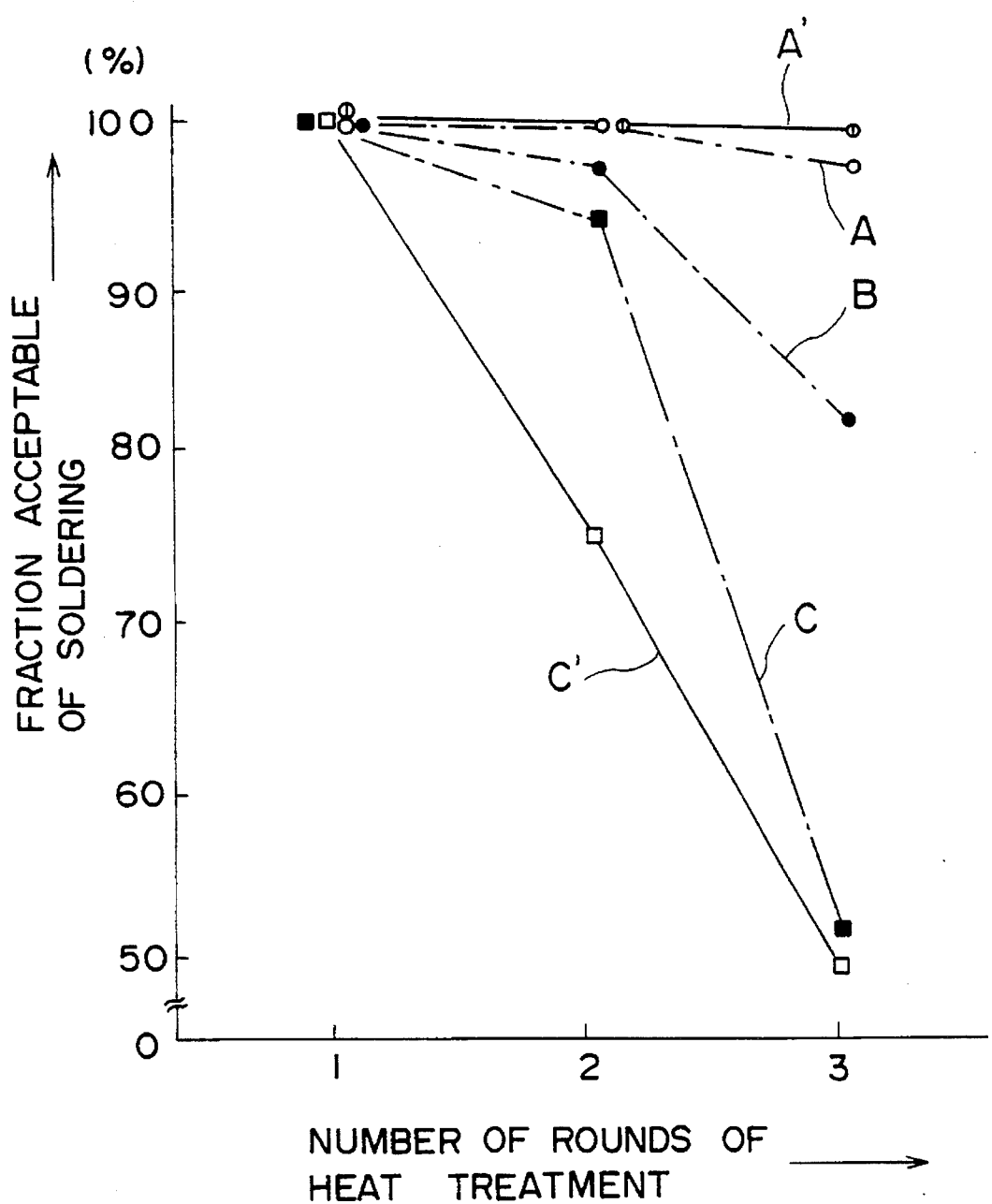
FIG. 10 is a graph showing the relation between the number of heat treatments performed one to three times in the infrared reflow treatment in an atmosphere of air and the fraction defective of the soldering work.

To test for heatproofness and chemical resistance, a treatment of passage througha reflow treating tank in the vapor phase of perfluorocarbon was performed one to three times on Samples A, B, and C and the samples were subjected to flow dip soldering. The copper through holes of these samples were examined to evaluate the outcome of the soldering work. FIG. 10 shows the relation between the number of heat treatments and the fraction acceptable of the soldering work. The oxidizing treatment enabled Sample A to acquire conspicuously improved fraction acceptable of the soldering work as compared with Sample B which escaped the oxidizing treatment. This fact indicates that the oxidizing treatment is notably effective in enhancing heatproofness and chemical resistance. This effect is prominent over that of Sample C which used the resin type preflux.

Separately, Sample A' was produced by using a preflux of Docoat H and performing the oxidizing treatment in the form of a heat treatment carried out in an atmosphere of air preparatorily to the infrared reflow and Sample C' was produced by the resin type preflux treatment. A treatment of passage through a tank for an infrared reflow treatment in an atmosphere of air was performed one to three times on these samples. The results were as shown in FIG. 10.

When the treatment of passage through the tank for infrared reflow treatment was carried out one to three times, it produced a fraction acceptable of nearly 100%. This fact indicates that the treatment was effective to a great extent.

Further for the purpose of confirming the effect of this invention, the following experiment was conducted by combining the step of vapor reflow and the step of infrared reflow in due consideration of the thermal effect possibly exerted on electronic parts being mounted on the opposite surfaces of the printed wiring board and also paying due respect to correction of the soldering during the reflow operation and replaceability of parts.

The copper on the printed wiring board a was given a preflux treatment with DOCOAT H produced by Sanwa Laboratory. The printed wiring board was subjected to a varying treatment indicated in the group of steps represented by conditions 1 to 8, and finally subjected to flow dip soldering. It was then tested for acceptability of the soldering work. Here, conditions 1 to 4 represent the cases in which the reflow was carried out without the oxidizing treatment and Conditions 5 to 8 the cases in which the oxidizing treatment was carried out in the form of a heat treatment performed under varying conditions of 120° to 150° C. of temperature and one to five minutes of time preparatorily to the infrared reflow in an atmosphere of air.

Figure 11:
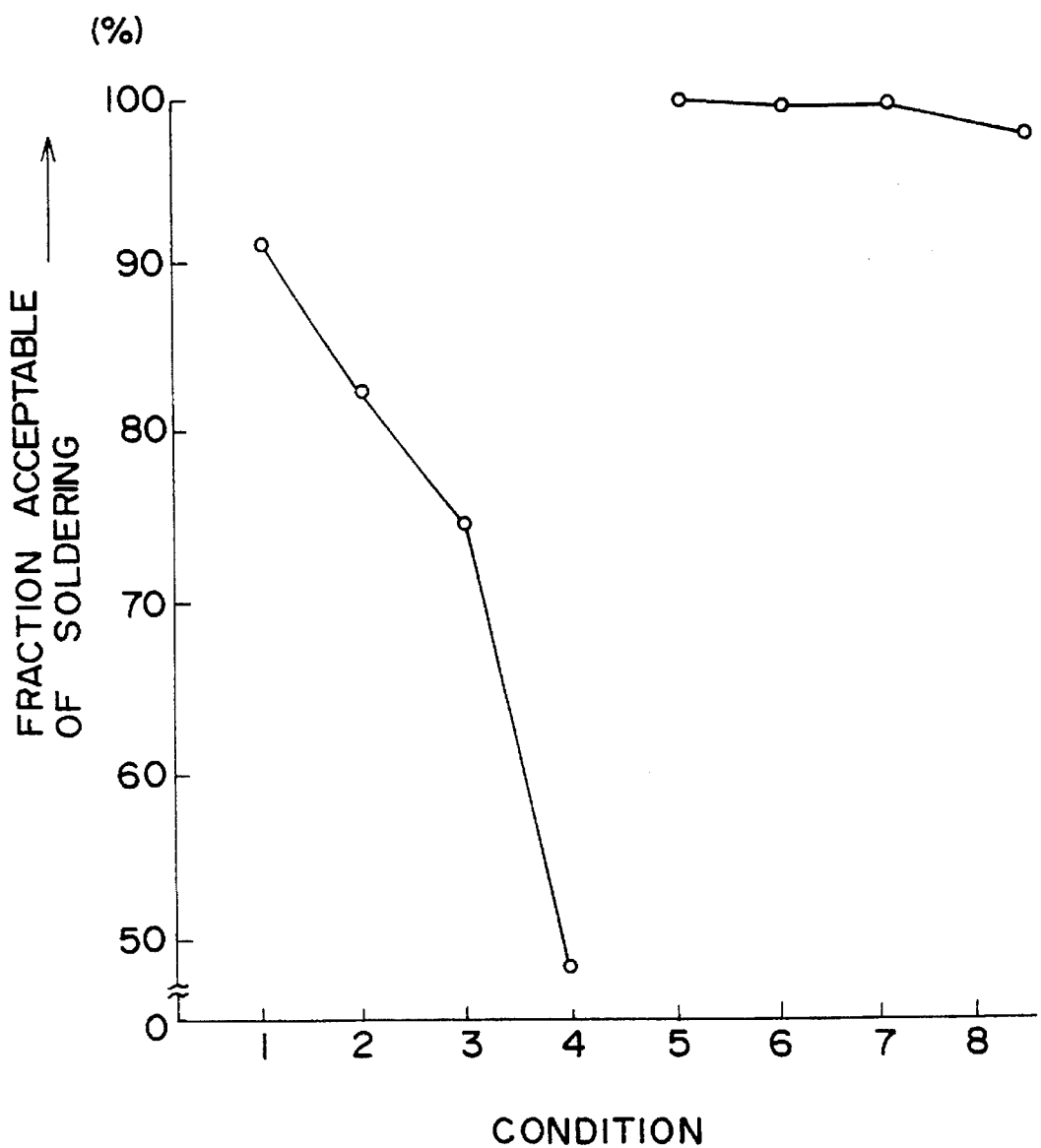
FIG. 11 is a graph showing the relation between the condition for the flow dip soldering selected from the group of conditions 1 to 8 and performed on the copper of a printed wiring board subsequently to the preflux treatment and the fraction defective of the soldering work.

Condition 1: Vapor reflow+Infrared reflow
Condition 2: Vapor reflow+Infrared reflow+Infrared reflow
Condition 3: Vapor reflow+Vapor reflow+Infrared reflow
Condition 4: Vapor reflow+Vapor reflow+Infrared reflow+Infrared reflow
Condition 5: Infrared reflow+Vapor reflow
Condition 6: Infrared reflow+Infrared reflow+Vapor reflow
Condition 7: Infrared reflow+Vapor reflow+Vapor reflow
Condition 8: Infrared reflow+Infrared reflow+Vapor reflow+Vapor reflow The results are shown in FIG. 11. It is clearly noted from FIG. 11 that in the operations of Conditions 1 to 4 which left off the oxidizing treatment, the fraction acceptable of the soldering work dwindled with the increasing number of rounds of the passage through the tank for reflow treatment. In contrast, in the operations of Conditions 5 to 8 in which the oxidizing treatment was performed in the form of heat treatment preparatory to the infrared reflow, those of Conditions 5 to 7 in which the treatment of passage through the tank for reflow treatment was made in a total of three rounds produced substantially perfect fractions acceptable of the soldering work exceeding 99% and the operation of condition 8 in which the treatment of passage through the tank for reflow treatment was made in a total of four rounds produced a fraction acceptable of the soldering work of 95%.

These results indicate that when the reflow soldering is performed several times for the mounting of electronic parts on the opposite surfaces of the printed wiring board 1, the soldering is attained with high efficiency by performing at least the first reflow in the form of infrared reflow which consists in applying heat in an atmosphere of oxygen.

This invention, therefore, is exceptionally effective in realizing high-density mounting of electronic parts on the opposite surfaces of the printed wiring board and also is amply effective in point of correction of the reflow solder and replacement of parts.

Figure 12:
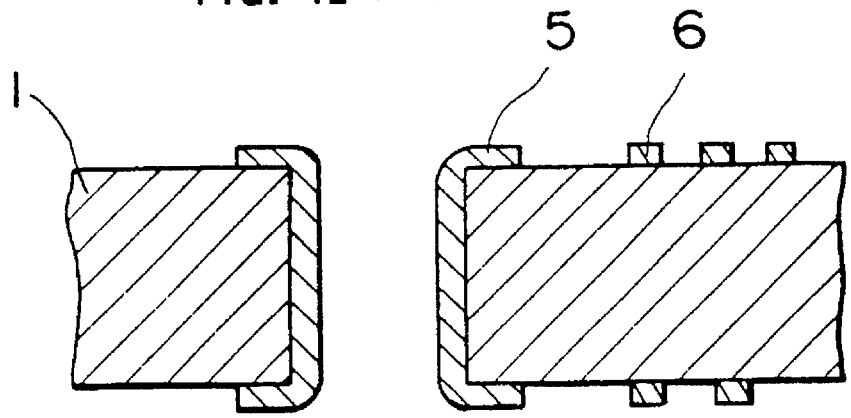
FIG. 12(a) is a cross section of part of a printed wiring board provided with copper or copper alloy through holes and copper or copper alloy patterns.
FIG. 12(b) is an explanatory diagram illustrating the outcome of the preflux treatment performed on the printed wiring board.
FIG. 12(c) is an explanatory diagram illustrating the outcome of the oxidizing treatment performed on the printed wiring board which has undergone the preflux treatment.
Figure 12:
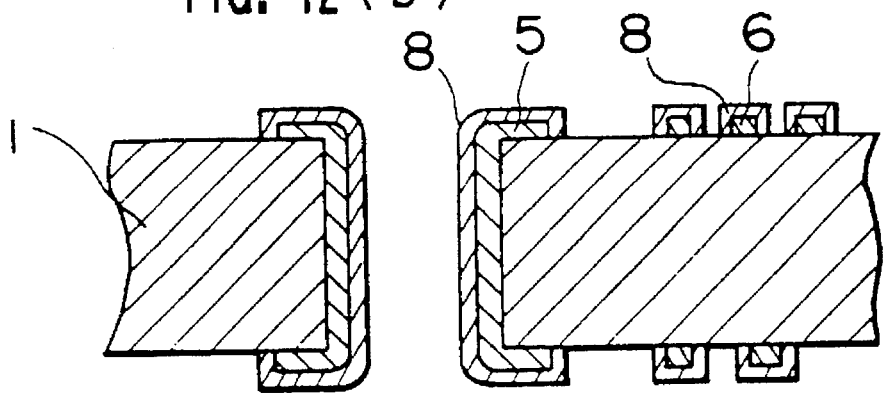
Figure 12:
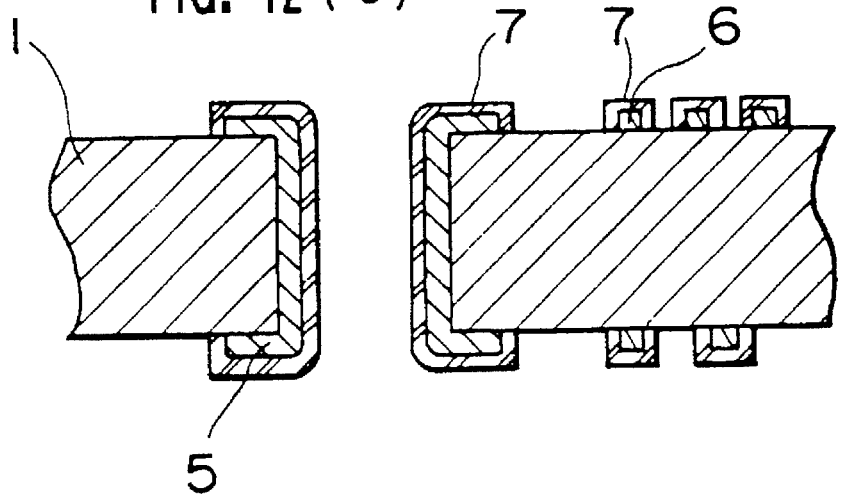

A process for forming a benzimidazole copper complex film 7 on the surfaces of copper or copper alloy through holes 5 and copper or copper alloy patterns 6 of the printed wiring board 1 when the oxidizing treatment is performed on the printed wiring board 1 after the preflux treatment is depicted in FIGS. 12(a), (b), and (c).

To be specific, the printed wiring board 1 provided with copper or copper alloy through holes 5 and copper or copper alloy patterns 6 is subjected to a preflux treatment so as to form, as illustrated in FIG. 12(b), on the surfaces of the copper or copper alloy through holes 5 and the copper or copper alloy patterns 6 a film 8 of 2-alkylbenzimidazole or 2-alkylbenzimidazole derivative represented by the general formula (3) or 2-phenylbenzaimidazole or 2-phenylbenzimidazole derivative represented by the general formula (4) and thereafter subjected to the oxidizing treatment so as to convert, as illustrated in FIG. 12(c), the film 8 on the surfaces of the copper or copper alloy through holes 5 and the copper or copper alloy patterns 6 into a film of benzimidazole copper complex 7.

To confirm the formation of the film of benzimidazole copper complex, the surface of copper plate was treated by immersion in a preflux solution prepared by dissolving 0.5% of 2-n-nonylbenzimidazole, 3% of an organic acid, and 100 ppm of copper ion in water at about 40° C. for a period in the range between 30 and 60 seconds and of the film on the copper surface was analyzed by the X-ray photoelectric spectrometry to detect possible change in the structure thereof.

The raw materials used for this analysis were as follows.
(1) 2-n-Nonylbenzimidazole (main raw material for preflux solution)
(2) Untreated copper plate
(3) Copper plate treated with 2-n-nonylbenzimidazole
(4) The sample of (3) heat treated in the open air at 120° for five minutes
(5) The sample of (3) heat treated in the air at 230° C. for three minutes The analysis was carried out by the use of an instrument produced by VG Corp. and marketed under trademark designation of "SCALAB 5" under the following conditions.
X-ray source: Alk α1, 2
X-ray output: 10 KV, 20 mA
Analyzer mode: Constant analyzer energy (CAE) mode pass energy (CAE) mode pass energy wide scan 50 eV narrow scan 20 eV
Slit: A4
Vacuum degree: $1 \times 10^{-9}$ Torr
Sample: Fixed on a sample stand with double-face adhesive tape
Correction of horizontal axis: Cis peak value of neutral carbon set at 284.6 eV
Detection angle of photoelectron: θ=90° (θ stands for the angle of inclination of detector relative to the surface of sample)

The NIS spectrum obtained in consequence of the X-ray photoelectric spectrometry was analyzed for qualitative determination of —N=, i.e. imidazole group, —NH—, and benzimidazole copper complex >N—Cu. The amounts of the functional groups present therein are shown in the following table.

| Sample | —N= (399.9 eV) | —NH— (398.4 eV) | N—Cu (399.0 eV) |
| --- | --- | --- | --- |
| (1) 2-n-Nonyl-benzimidazole | 4.9% | 50% | 0% |
| (2) Untreated copper plate | 0% | 0% | 0% |
| (3) Copper plate treated with 2-n-nonyl-benzimidazole | 13% | 17% | 70% |
| (4) Sample of (3) heat-treated in open air at 120° C. for five minutes | 2% | 2% | 96% |
| (5) Sample of (3) heat-treated in open air at 230° C. for three minutes | 1% | 2% | 97% |

The film formed on the surface of copper with a preflux having a benzimidazole derivative (2-n-nonylbenzimidazole) as a main component thereof and additionally containing an organic acid and copper ion allowed formation therein of 70% of copper complex but suffered survival of 30% of free imidazole group —N= and —NH—. The oxidizing treatment such as, for example, a heat treatment in the open air at 120° C. for five minutes or a heat treatment in the open air at 230° C. for three minutes brought about substantial absence of the free imidazole group and increase of the amount of benzimidazole copper complex to 96% or 97%, with the result that the reaction for the formation of the complex thoroughly proceeded to give rise to a film of benzimidazole copper complex.

The formation of the film of benzimidazole copper complex 7 in the manner described above produces a conspicuous effect of enhancing the solderability of reflow for the mounting of electronic parts on the printed wiring board 1. It also allows improvement of the density of mounting on the printed wiring board 1 and contributes to miniaturization of electronic devices.

In accordance with this invention, the heatproofness and chemical resistance of the printed wiring board can be conspicuously improved by performing a preflux treatment on copper or copper alloy by the use of benzimidazole or benzimidazole derivative represented by the general formula (1) or benzimidazole or benzimidazole derivative represented by the general formula (2) and then subjecting the outcome of the preflux treatment to the oxidizing treatment as described in detail above.

The printed wiring board contemplated by this invention produces a prominent effect of improving the solderability of reflow during the mounting of electronic parts on the printed wiring board because the oxide film has been formed on the metallic surface of the printed wiring board for mounting of electronic parts by applying the preflux represented by the general formula (1) or the general formula (2) to the printed wiring board on which circuits have been already formed and then subjecting the resultant preflux-coated printed wiring board to the oxidizing treatment. As a result, this invention can enhance the density of mounting on the printed wiring board and contributes to miniaturization of electronic devices.

The method of this invention for the production of the printed wiring board is capable of producing a printed board which enjoys high fraction acceptable of the printing work and ample wettability and excels in point of work environment and safety because it comprises applying a preflux represented by the general formula (1) or the general formula (2) to the printed wiring board on which circuits have been already formed and then subjecting the preflux-coated printed wiring board to the oxidizing treatment.

The method of this invention for the production of the printed wiring board is characterized by appling a preflux represented by the general formula (1) or the general formula (2) to the printed wiring board on which circuits have been already formed and then subjecting the preflux-coated printed wiring board to the reflow treatment which is performed in the form of a heat treatment in the air or in an atmosphere of oxygen. Particularly when the reflow treatment includes infrared reflow treatment at least in the initial stage thereof, it brings about an effect of attaining the oxidation of the preflux without requiring any independent oxidizing treatment subsequently to the preflux treatment in the process of production of the printed wiring board in addition to the effect derivable by the aforementioned method for production of the printed wiring board.

Further in accordance with this invention, the heatproofness and chemical resistance of the printed wiring board can be conspicuously improved by performing the preflux treatment on copper or copper alloy by the use of 2-alkylbenzimidazole or 2-alkylbenzimidazole represented by the general formula (3) or 2-phenylbenzimidazole or 2-phenylbenzimidazole derivative represented by the general formula (4) and then subjecting the outcome of the preflux treatment to the oxidizing treatment.

The printed wiring board contemplated by this invention brings about a prominent effect of improving the solderability of reflow in the mounting of electronic parts on the printed wiring board because it has the film of benzimidazole copper complex on the metallic surface of the printed wiring board for mounting by a procedure which comprises applying the preflux represented by the general formula (3) or the general formula (4) to the printed wiring board on which circuits have been already formed and subjecting the preflux-coated printed wiring board to the oxidizing treatment. It is also capable of enhancing the density of mounting on the printed wiring board and contributing to miniaturization of electronic devices.

The method for the production of a printed wiring board contemplated by this invention is characterized by applying the preflux represented by the general formula (3) or the general formula (4) to the printed wiring board on which circuits have been already formed and then subjecting the preflux-coated printed wiring board to a reflow treatment which consists in applying heat thereto in the air or in an atmosphere of oxygen. Particularly when the reflow treatment includes an infrared reflow treatment at least in the initial stage thereof, it is capable of bringing about an effect of realizing the oxidation of the preflux without requiring any independent oxidizing treatment subsequently to the preflux treatment in the process for production of the printed wiring board in addition to the effect produced by the method for production of the printed wiring board.

Though this invention has been described with reference to preferred embodiments thereof, it will be understood by persons of ordinary skill in the art that this invention can be practiced otherwise without departure from the spirit and scope of this invention.

We claim:

1. A method for the use of a preflux, comprising:

(a) applying to a surface of a metal a preflux containing as an active component thereof an imidazole compound, said imidazole compound being represented by the following general formula (1):

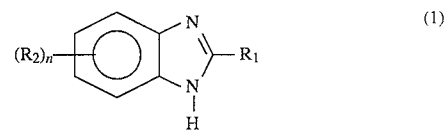

wherein $R_1$ stands for H or an alkyl group of one to 17 carbon atoms, $R_2$ stands for H or an alkyl group of one to six carbon atoms, and n stands for an integer in the range between 0 and 3, or by the following general formula (2):

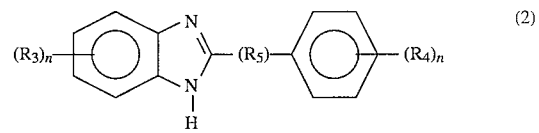

wherein $R_3$ stands for H or an alkyl group of one to six carbon atoms, $R_4$ stands for H or an alkyl group of one to six carbon atoms, $R_5$ stands for an alkyl group of zero to seven carbon atoms, and n stands for an integer in the range between 0 and 3; and (b) performing an oxidizing treatment on said metal.

2. A method according to claim 1, wherein said imidazole compound is a compound represented by the following general formula (3):

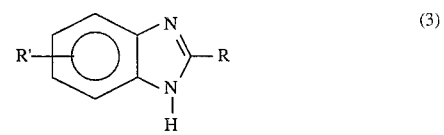

(wherein R stands for H or an alkyl group of one to 17 carbon atoms and R' for H or an alkyl group of one to three carbon atoms) or the following general formula (4):

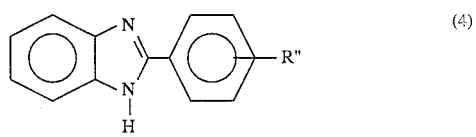

(wherein R" stands for H or an alkyl group of zero to three carbon atoms).

3. A method according to claim 1, wherein said oxidizing treatment is a heat treatment in an atmosphere of air.

4. A method according to claim 1, wherein said oxidizing treatment is carried out in the form of a treatment by the use of a chemical solution.

5. A method according to claim 1, wherein said oxidizing treatment is carried out in the form of a treatment by irradiation with ultraviolet light.

6. A method for the production of a printed wiring board, comprising:

(a) applying a preflux to a printed wiring board, said preflux being represented by the following general formula (1):

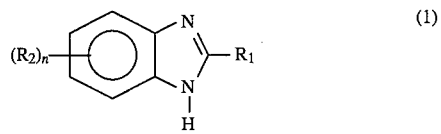

wherein $R_1$ stands for H or an alkyl group of one to 17 carbon atoms, $R_2$ stands for H or an alkyl group of one to six carbon atoms, and n stands for an integer in the range between 0 and 3, or by the following general formula (2):

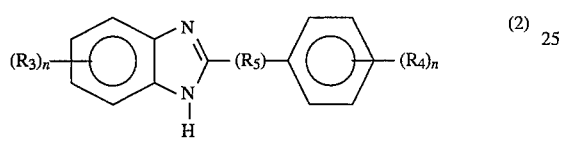

wherein $R_3$ stands for H or an alkyl group of one to six carbon atoms, $R_4$ stands for H or an alkyl group of one to six carbon atoms, $R_5$ stands for an alkyl group of zero to seven carbon atoms, and n stands for an integer in the range between 0 and 3, to a printed wiring board on which circuits have been formed; and (b) performing an oxidizing treatment on said printed wiring board.

7. A method according to claim 6, wherein said preflux applied to said printed wiring board on which circuits have been formed is a compound represented by the following general formula (3):

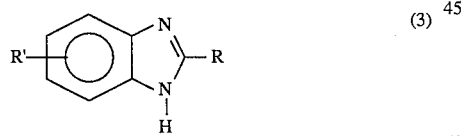

wherein R stands for H or an alkyl group of one to 17 carbon atoms and R' for H or an alkyl group of one to three carbon atoms, or the following general formula (4):

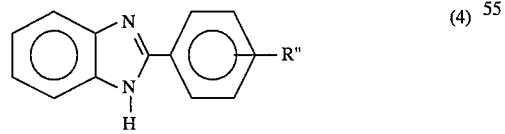

wherein R" stands for H or an alkyl group of zero to three carbon atoms.

8. A method according to claim 6, wherein said oxidizing treatment is a heat treatment in an atmosphere of air.

9. A method according to claim 6 or 7, wherein said oxidizing treatment is carried out in the form of a treatment by the use of a chemical solution.

10. A method according to claim 6 or 7, wherein said oxidizing treatment is carried out in the form of a treatment by irradiation with ultraviolet light.

11. A method for the production of a printed wiring board, comprising:

(a) applying a preflux, said preflux being represented by the following general formula (1):

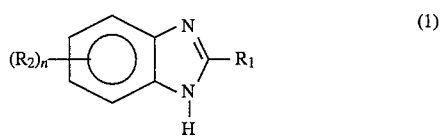

wherein $R_1$ stands for H or an alkyl group of one to 17 carbon atoms, $R_2$ stands for H or an alkyl group of one to six carbon atoms, and n stands for an integer in the range between 0 and 3, or by the following general formula (2):

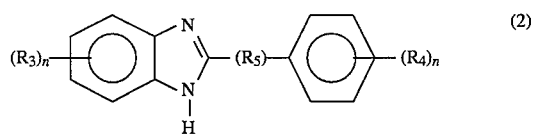

wherein $R_3$ stands for H or an alkyl group of one to six carbon atoms, $R_4$ stands for H or an alkyl group of one to six carbon atoms, $R_5$ stands for an alkyl group of zero to seven carbon atoms, and n stands for an integer in the range between 0 and 3, to a printed wiring board on which circuits have been formed; and (b) performing on said printed wiring board an oxidizing reflow treatment by application of heat in ambient air or an atmosphere of oxygen.

12. A method according to claim 11 wherein said preflux applied to said printed wiring board on which circuits have been formed is a compound represented by the following general formula (3):

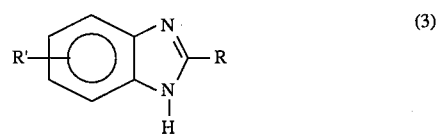

wherein R stands for H or an alkyl group of one to 17 carbon atoms and R' for H or an alkyl group of one to three carbon atoms, or the following general formula (4):

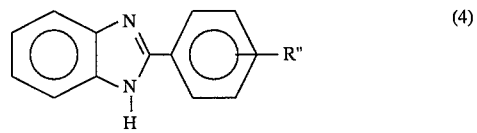

wherein R" stands for H or an alkyl group of zero to three carbon atoms.

13. A method according to claim 11 or, wherein said reflow treatment has an infrared reflow treatment to be performed at least in the initial stage thereof.

14. A method for the production of a printed wiring board, comprising:

(a) applying to a printed wiring board a preflux containing as an active component thereof a substance derived from a benzimidazole group; and (b) performing an oxidizing treatment on said printed wiring board.

15. A method according to claim 14, wherein said oxidizing treatment is a heat treatment in an atmosphere of air.

16. A method according to claim 14, wherein said oxidizing treatment is carried out in the form of a treatment by the use of a chemical solution.

17. A method according to claim 14, wherein said oxidizing treatment is carried out in the form of a treatment by irradiation with ultraviolet light.

* * * * *